United States Patent
Shirley et al.

[11] Patent Number: 5,974,903
[45] Date of Patent: Nov. 2, 1999

[54] METHOD AND APPARATUS FOR IN SITU VISUAL INSPECTION OF DIE PRODUCTS IN TAPE AND REEL SHIPPING MEDIUM

[75] Inventors: R. Scott Shirley, Tempe; Chad D. Bowser, Chandler, both of Ariz.

[73] Assignee: Intel Corporation, Santa Clara, Calif.

[21] Appl. No.: 09/004,477

[22] Filed: Jan. 8, 1998

[51] Int. Cl.⁶ .................................................. H01L 21/66
[52] U.S. Cl. ............................................................ 73/865.8
[58] Field of Search ............................ 73/865.8; 349/79, 349/80, 86, 87, 125, 126

[56] References Cited

U.S. PATENT DOCUMENTS 4,389,669  6/1983  Epstein et al. .
5,473,425  12/1995  Tokumaru et al. .

*Primary Examiner*—Robert Raevis
*Attorney, Agent, or Firm*—Blakely, Sokoloff, Taylor & Zafman LLP

[57] ABSTRACT

An inspection station that is used to inspect an integrated circuit which is contained within a carrier tape and covered with a cover tape. The inspection station may include a spindle that receives an input reel which contains a carrier tape and a plurality of integrated circuits. The carrier tape can be attached to an output reel that is rotated by a drive motor. Another drive motor moves the carrier tape beneath a microscope that is located between the input reel and the output reel. The microscope may be coupled to a camera and a monitor which displays the integrated circuit. The inspection station may also include a de-taper mechanism which removes the cover tape before the integrated circuit is moved beneath the microscope, and a taper mechanism that reapplies cover tape back onto the integrated circuit. Removing the cover tape provides an unobstructed view of the integrated circuit. Removing the cover tape also allows the operator to replace defective integrated circuits on the carrier tape.

11 Claims, 1 Drawing Sheet

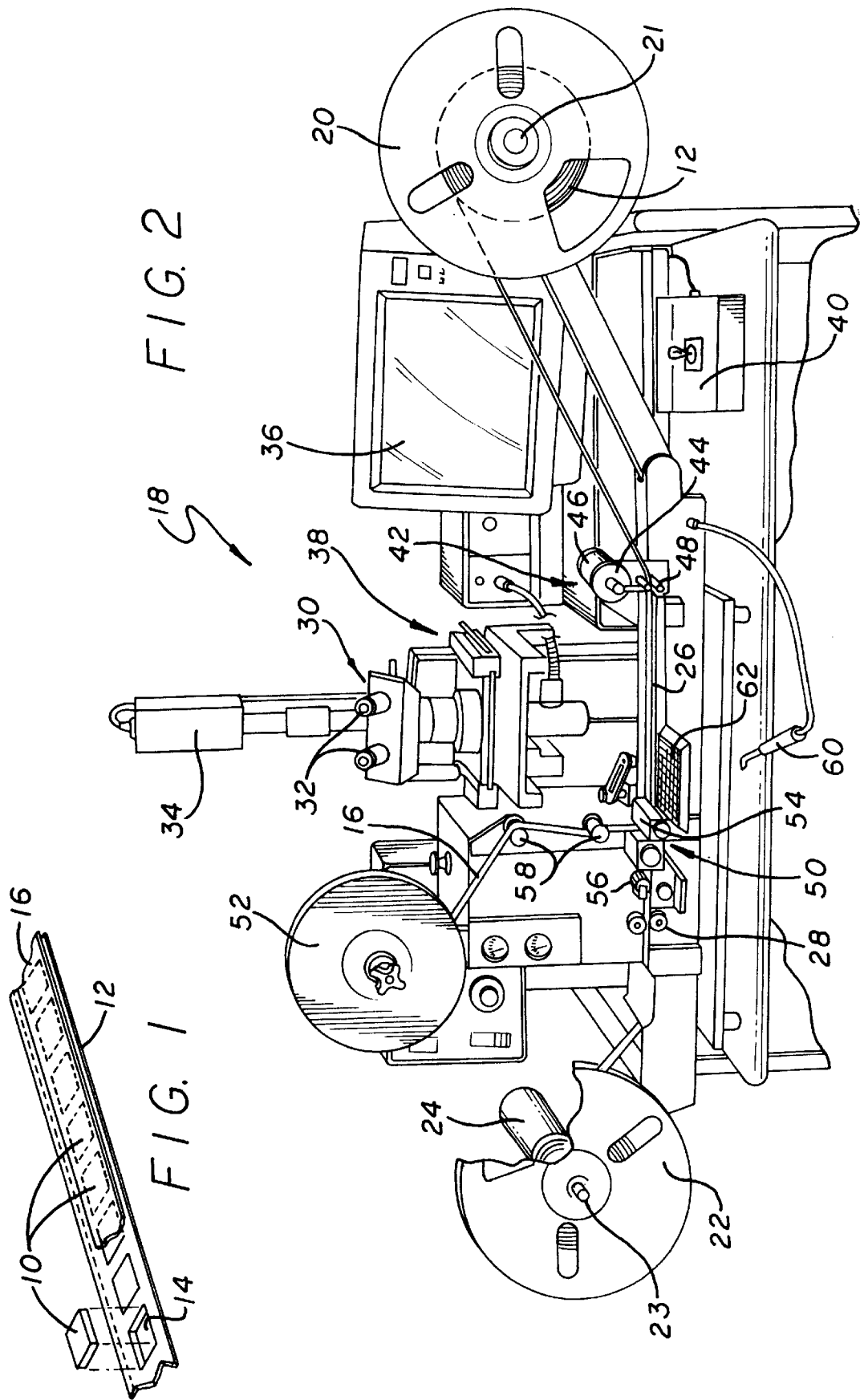

METHOD AND APPARATUS FOR IN SITU VISUAL INSPECTION OF DIE PRODUCTS IN TAPE AND REEL SHIPPING MEDIUM

BACKGROUND OF THE INVENTION

1. Field of the Invention

The present invention relates to an inspection station that is used to visually inspect integrated circuits that are contained within a carrier tape and covered with a cover tape.

2. Background Information

Integrated circuits are typically cut from a wafer and then subsequently assembled into a package that is mounted to a printed circuit board. The integrated circuits (dice or packages) may be visually inspected to insure that each circuit meets certain manufacturing specifications. The integrated circuits are typically carried in a tray which has individual circuit compartments. The circuits can be inspected by placing the tray beneath a microscope. Each integrated circuit can be individually inspected by moving the tray to align a single die beneath the microscope. The microscope may be coupled to a camera and a monitor which displays a magnified image of the integrated circuits. A camera/monitor system is usually not used for trays because the eyepiece of the microscope remains stationary while the tray is positioned.

There has been developed another technique for transporting integrated circuits by placing the die onto a flexible carrier tape. The tape and integrated circuits are rolled onto a reel that can be easily shipped and stored. The assembly further includes a cover tape that secures the integrated circuits within the carrier tape. The cover tape is typically constructed from a semi-opaque material which prevents visual inspection of the integrated circuits. Any defective circuits must be rejected and replaced with a good circuit. While the tray's cover can be easily removed and replaced by hand, the carrier tape's cover tape must be removed and new tape applied by a mechanism. It would be desirable to provide an inspection station that would allow visual inspection of integrated circuits which are contained within a carrier tape.

SUMMARY OF THE INVENTION

An embodiment of the present invention is an inspection station that is used to inspect an integrated circuit which is contained within a carrier tape and covered with a cover tape. The inspection station includes a spindle which receives an input reel that contains a carrier tape and a plurality of integrated circuits. The carrier tape can be attached to an output reel. A drive motor moves the carrier tape beneath a microscope which is located between the input reel and the output reel. The inspection station may also include a de-taper mechanism which removes the cover tape before the integrated circuit is moved beneath the microscope, and a taper mechanism that reapplies cover tape back onto the integrated circuit.

BRIEF DESCRIPTION OF THE DRAWINGS

FIG. 1 is a perspective view of a carrier tape that holds a plurality of integrated circuits;

FIG. 2 is a perspective view of an embodiment of an inspection station of the present invention.

DETAILED DESCRIPTION OF THE INVENTION

One embodiment of the present invention is an inspection station that is used to inspect an integrated circuit which is contained within a carrier tape and covered with a cover tape. The inspection station may include a spindle that receives an input reel which contains a carrier tape and a plurality of integrated circuits. The carrier tape can be attached to an output reel that is rotated by a drive motor. Another drive motor moves the carrier tape beneath a microscope that is located between the input reel and the output reel. The microscope may be coupled to a camera and a monitor which displays the integrated circuit. The inspection station may also include a detaper mechanism which removes the cover tape before the integrated circuit is moved beneath the microscope, and a taper mechanism that reapplies cover tape back onto the integrated circuit. Removing the cover tape provides an unobstructed view of the integrated circuit. Removing the cover tape also allows the operator to replace defective integrated circuits on the carrier tape.

Referring to the drawings more particularly by reference numbers, FIG. 1 shows a plurality of integrated circuits 10 that are mounted to a carrier tape 12. Each integrated circuit 10 is typically located within an individual cavity 14 formed into the carrier tape 12. A cover tape 16 secures the integrated circuits 10 to the carrier tape 12. Both the carrier tape 12 and the cover tape 16 are constructed from a flexible material that can be rolled onto a reel.

FIG. 2 shows an embodiment of an inspection station 18 of the present invention. The inspection station 18 may include an input reel 20 that is mounted to a spindle 21. Wound around the input reel 20 is a carrier tape 12, cover tape (not shown) and a plurality of integrated circuits (not shown). The carrier tape 12 is also attached to an output reel 22. The output reel 22 can also be mounted to a spindle 23. The spindle 23 may be rotated by a drive motor 24. Rotation of the spindle 23 maintains the carrier tape 12 in tension and winds it onto the output reel 22. The carrier tape 12 can slide along a rail 26 of the station 18. The station 18 may include a drive motor sprocket 28 that pulls the carrier tape 12 through the inspection station 18.

The carrier tape 12 is moved beneath a microscope 30. The microscope 30 may have a pair of eyepieces 32 which allow an operator to visually inspect the integrated circuits 10 on the carrier tape 12. The microscope 30 may be coupled to a camera 34 and a monitor 36 which displays the integrated circuits 10. The microscope 30 may have various lenses and mechanisms which allow the operator to vary the magnification and focus of the scope 30.

The microscope 30 may be mounted to an x-y table 38 that is coupled to an input device 40 such as a "joystick". The x-y table 38 can move the microscope 30 relative to the carrier tape 12. The operator can manipulate the joystick to move the microscope 30 and view different areas of an integrated circuit 10. The input device 40 may also be coupled to the stepper motor drive sprocket 28 to control the movement of the carrier tape 12 beneath the microscope 30.

The inspection station 18 may include a de-taper mechanism 42 which removes the cover tape 16 before the integrated circuits 10 are moved beneath the microscope 30. The de-taper mechanism 42 may include a spool 44 that is coupled to a drive motor 46. The cover tape 16 is wrapped around the spool 44 and is pulled up from the integrated circuits 10 when the motor 46 is energized. The de-taper mechanism 42 may include a pair of tension rollers 48 that maintain the cover tape 16 in tension. The drive motor 46 can also be coupled to the input device 40 so that the cover tape 16 is pulled off the integrated circuits when the carrier tape 12 is being moved beneath the microscope 30.

The inspection station 18 may also have a taper mechanism 50 which reapplies cover tape 16 to the integrated circuits 10 after inspection beneath the microscope 30. The taper mechanism 50 may include a reel 52 that holds a cover tape 16. The mechanism 50 may also include a right angle block 54 which loads the cover tape 16 onto the carrier tape 12 and press wheels 56 which press the cover tape 16 onto the carrier tape 12. The mechanism 50 may also have a pair of tension rollers 58. The reel 52 may be free spinning so that the cover tape 16 is loaded onto the integrated circuits as the carrier tape 12 is being pulled past the right angle block 54.

The station 18 may further have a vacuum pencil 60 which allows the operator to remove a defective integrated circuit 10 and place a new replacement circuit 10 back onto the tape 12. The replacement circuits 10 may be located on a tray 62.

In operation, an input reel 20 is mounted to the spindle 21 and the end of the carrier tape 12 is pulled past the microscope 30 and attached to the output reel 22. The end of the carrier tape 12 is typically inserted into a corresponding slot in the reel 22. The end of the cover tape 16 is also pulled off and loaded onto the de-taper spool 44, typically by inserting the end of the tape 16 into a slot of the spool 44. The replacement cover tape is also loaded by pulling the tape through the rollers 58, block 54 and wheels 56 and inserting the tape end into the slot of reel 22.

The operator can manipulate the input device 40 to move each integrated circuit 10 beneath the microscope 30 and inspect the same. The x-y table 38 can move the scope 30 to view various portions of the integrated circuit. The vacuum pencil 60 can be utilized to replace defective integrated circuits. The de-taper 42 and taper 50 mechanisms remove and reapply the cover tape 16, respectively, to allow an unobstructed visual inspection of the circuits.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An inspection station that is used to inspect an integrated circuit that is contained within a carrier tape and covered by a cover tape, the carrier tape, cover tape and integrated circuit are rolled onto an input reel, comprising:

a spindle that receives the input reel;

an output reel that is attached to the carrier tape;

a drive motor that moves the carrier tape from the input reel to said output reel;

a microscope that is located between the input reel and said output reel and which can allow visual inspection of the integrated circuit;

a de-taper mechanism which removes the cover tape from the integrated circuit; and, a taping mechanism which applies cover tape to the integrated circuit.

2. The station as recited in claim 1, further comprising an x-y table that moves said microscope relative to the carrier tape.

3. The station as recited in claim 2, further comprising a manual input device that allows an operator to control said x-y table.

4. The station as recited in claim 1, further comprising a camera that is coupled to said microscope and a monitor that is coupled to said camera.

5. The station as recited in claim 1, further comprising a vacuum pencil that can pull the integrated circuit off of the carrier tape.

6. The station as recited in claim 1, wherein said detaper mechanism includes a motor driven spool that is attached to the cover tape.

7. The station as recited in claim 1, further comprising a tray that holds a replacement integrated circuit.

8. An inspection station that is used to inspect an integrated circuit that is contained within a carrier tape and covered by a cover tape, the carrier tape, cover and integrated circuit are rolled onto an input reel, comprising:

a spindle that receives the input reel;

an output reel that is attached to the carrier tape;

a drive motor that moves the carrier tape from the input reel to said output reel;

a microscope that is located between the input reel and said output reel and which can allow visual inspection of the integrated circuit;

an x-y table that moves said microscope relative to the carrier tape;

a manual input device that allows an operator to control said x-y table;

a camera that is coupled to said microscope;

a monitor that is coupled to said camera;

a de-taper mechanism which removes the cover tape from the integrated circuit; and, a taping mechanism which applies cover tape to the integrated circuit.

9. The station as recited in claim 8, further comprising a vacuum pencil that can pull the integrated circuit off of the carrier tape.

10. The station as recited in claim 9, further comprising a tray that holds a replacement integrated circuit.

11. The station as recited in claim 10, wherein said detaper mechanism includes a motor driven spool that is attached to the cover tape.

\* \* \* \* \*

UNITED STATES PATENT AND TRADEMARK OFFICE
CERTIFICATE OF CORRECTION

PATENT NO. : 5,974,903
DATED : November 2, 1999
INVENTOR(S) : R. Scott Shirley; Chad D. Bowser It is certified that error appears in the above-identified patent and that said Letters Patent is hereby corrected as shown below:

On title page, item [54] change title to read:

--METHOD AND APPARATUS FOR IN SITU VISUAL INSPECTION OF DIE PRODUCTS AND PACKAGED PRODUCTS IN TAPE AND REEL SHIPPING MEDIUM --

Signed and Sealed this

First Day of August, 2000

*Attest:*

Q. TODD DICKINSON

*Attesting Officer*  *Director of Patents and Trademarks*